United States Patent
Klonis et al.

[11] Patent Number: 5,939,785
[45] Date of Patent: Aug. 17, 1999

[54] MICROMECHANICAL DEVICE INCLUDING TIME-RELEASE PASSIVANT

[75] Inventors: Homer B. Klonis; Arlene Y. Yeh, both of Dallas; Mark Reed, Mesquite, all of Tex.

[73] Assignee: Texas Instruments Incorporated, Dallas, Tex.

[21] Appl. No.: 08/833,166

[22] Filed: Apr. 3, 1997

Related U.S. Application Data

[60] Provisional application No. 60/015,185, Apr. 12, 1996.

[51] Int. Cl.$^6$ .................................................. H01L 27/14
[52] U.S. Cl. ........................ 257/729; 257/686; 257/431; 359/838
[58] Field of Search .................................. 257/254, 417, 257/420, 682, 431, 729; 359/838, 896

[56] References Cited

U.S. PATENT DOCUMENTS

| | | | |
|---|---|---|---|
| 3,849,187 | 11/1974 | Fetscher et al. | 117/201 |
| 4,042,955 | 8/1977 | Imai et al. | 357/72 |
| 4,352,119 | 9/1982 | Bardens et al. | 357/78 |
| 4,426,769 | 1/1984 | Grabbe | 29/588 |
| 4,563,697 | 1/1986 | Miura | 357/26 |
| 4,630,095 | 12/1986 | Otsuka et al. | 357/78 |
| 4,706,106 | 11/1987 | Shiba et al. | 357/78 |
| 4,768,081 | 8/1988 | Moeller | 257/682 |
| 4,769,345 | 9/1988 | Butt et al. | 437/217 |
| 5,061,049 | 10/1991 | Hornbeck | 359/224 |
| 5,096,279 | 3/1992 | Hornbeck et al. | 359/230 |
| 5,244,707 | 9/1993 | Shores | 428/76 |
| 5,293,511 | 3/1994 | Poradish et al. | 257/434 |
| 5,331,454 | 7/1994 | Hornbeck | 359/224 |
| 5,399,805 | 3/1995 | Tyler et al. | 257/682 |
| 5,512,374 | 4/1996 | Wallace et al. | 428/422 |
| 5,576,878 | 11/1996 | Henck | 359/224 |
| 5,610,438 | 3/1997 | Wallace et al. | 257/682 |
| 5,629,538 | 5/1997 | Lipphardt et al. | 257/254 |

*Primary Examiner*—Olik Chaudhuri
*Assistant Examiner*—Nathan K. Kelley
*Attorney, Agent, or Firm*—Charles A. Brill; Frederick J. Telecky, Jr.; Richard L. Donaldson

[57] ABSTRACT

An electronic device (10) such as that of the micromechanical type having a time-released source of a passivant (20). This source (20) is preferably comprised of an impregnated molecular sieve/binder combination, preferably being a polymer. The passivant may be PFDA. The time-released passivant source continuously over the life of the device reduces any tendency of engaged or contacting elements to stick, adhere, or otherwise resist separation. The present invention finds particular use in spatial light modulators of the DMD type. The molecular sieve/binder can also include getter/desiccant source, such as a non-evaporable getter to remove moisture from the hermetically sealed electronic device.

15 Claims, 1 Drawing Sheet

MICROMECHANICAL DEVICE INCLUDING TIME-RELEASE PASSIVANT

CROSS REFERENCE TO RELATED APPLICATIONS

This application claims the benefit of U.S. Provisional application Ser. No. 60/015,185 filed Apr. 12, 1996.

| SERIAL NUMBER | TITLE | FILING DATE |
|---|---|---|
| 08/311,480 | Manufacturing Method for Micromechanical Devices | 08/23/94 |
| 08/239,497 U.S. Pat. No. 5,512,374 | PFPE Coatings for Micro-Mechanical Devices | 05/09/94 |
| 08/220,429 U.S. Pat. No. 5,576,878 | Use of Incompatible Materials to Eliminate Sticking of Micro-Mechanical Devices | 03/30/94 |
| 08/400,730 | Micro-Mechanical Device with Reduced Adhesion and Friction | 03/08/95 |
| 08/401,048 U.S. Pat. No. 5,610,438 | Micro-Mechanical Device | 03/08/95 |

FIELD OF THE INVENTION

This invention relates to improved micro-mechanical devices and to a method for producing such improved devices. More particularly, the present invention relates to micro-mechanical devices having relatively selectively movable elements which may engage or contact, any tendency of the engaged or contacted elements to stick, adhere or otherwise resist separation being ameliorated or eliminated in the improved device through the use of the method according to this invention. The present invention relates to an improved micromechanical device, including micromechanical devices such as actuators, motors, sensors, and more specifically, a spatial light modulator (SLM), and more particularly, to a packaged SLM of the digital micromirror device ("DMD") variety having improved operating characteristics.

BACKGROUND OF THE INVENTION

SLM's are transducers that modulate incident light in a spatial pattern pursuant to an electrical or other input. The incident light may be modulated in phase, intensity, polarization or direction. SLM's of the deformable mirror class include micromechanical arrays of electronically addressable mirror elements or pixels which are selectively movable or deformable. Each mirror element is movable in response to an electrical input to an integrated addressing circuit formed monolithically with the addressable mirror elements in a common substrate. Incident light is modulated in direction and/or phase by reflection from each element.

As set forth in greater detail in commonly assigned U.S. Pat. No. 5,061,049 to Hornbeck, deformable mirror SLM's are often referred to as DMD's (for "Deformable Mirror Device" or "Digital Micromirror Device") and are manufactured by Texas Instruments of Dallas Texas. There are three general categories of deformable mirror SLM's: elastomeric, membrane and beam. The latter category includes torsion beam DMD's, cantilever beam DMD's and flexure beam DMD's.

Each movable mirror element of all three types of beam DMD includes a relatively thick metal reflector supported in a normal, undeflected position by an integral, relatively thin metal beam. In the normal position, the reflector is spaced from a substrate-supported, underlying control electrode which may have a voltage selectively impressed thereon by the addressing circuit.

When the control electrode carries an appropriate voltage, the reflector is electrostatically attracted thereto and moves or is deflected out of the normal position toward the control electrode and the substrate. Such movement or deflection of the reflector causes deformation of its supporting beam storing therein potential energy which tends to return the reflector to its normal position when the control electrode is de-energized. The deformation of a cantilever beam comprises bending about an axis normal to the beam's axis; that of a torsion beam comprises deformation by twisting about an axis parallel to the beam's axis; that of a flexure beam, which is a relatively long cantilever beam connected to the reflector by a relatively short torsion beam, comprises both types of deformation, permitting the reflector to move in piston-like fashion. Thus, the movement or deflection of the reflector of a cantilever or torsion beam DMD is rotational with some parts of the reflector rotating toward the substrate; other parts of the reflector rotate away from the substrate if the axis of rotation is other than at an edge or terminus of the reflector. The movement or deflection of the reflector of a flexure beam DMD maintains all points on the reflector generally parallel with the substrate.

When the reflector of a beam DMD is operated in binary fashion by its addressing circuit, it occupies one of two positions, the first being the normal position which is set by the undeformed beam, the second position being a deflected position. In one of the positions, the reflector reflects incident light to a selected site, such as a viewing screen, the drum of a xerographic printer or other photoreceptor. In the other position, incident light is not reflected to the photoreceptor, and may be reflected to a light absorber.

A typical DMD includes an array of numerous pixels, the reflectors of each of which are selectively positioned to reflect or not reflect light to a desired site.

Because a potential difference must exist between the reflector and the control electrode to deflect the reflector, it is undesirable for these two elements to engage. Engagement of a deflected reflector and its control electrode effects current flow therethrough which may weld them together and/or cause the thinner beam to melt or fuse. In either event the functionality of the involved pixel is destroyed. In response to the foregoing problem, a landing electrode may be associated with each reflector. Typically, in the case of a cantilever- or torsion-beam DMD, the landing electrode resides on the substrate at a greater distance from the rotational axis than the control electrode, both distances being taken parallel to the reflector in its normal position. In a flexure-beam DMD, the top of the landing electrode may be elevated above the top of the control electrode. In view of the foregoing, the deflected reflector ultimately engages the landing electrode, but not the control electrode. To prevent damage to the reflector, the landing electrode is maintained at the same potential as the reflector. Again, see commonly assigned U.S. Pat. No. 5,061,049.

Notwithstanding the use of a landing electrode, it has been found that a deflected reflector will sometimes stick or adhere to its landing electrode. Such sticking or adherence may prevent the energy stored in the deformed beam from returning or "resetting" the reflector to its normal position after the control electrode is de-energized. It has been postulated that such sticking is caused by welding or intermolecular attraction between the reflector and the landing electrode or by high surface energy substances sorbed or deposited on the surface of the landing electrode and/or on the portion of the reflector which contacts the landing electrode. Substances which may impart high surface energy to the reflector-landing electrode interface include water vapor and other ambient gases (e.g., carbon monoxide, carbon dioxide, oxygen, nitrogen), and gases and organic components resulting from or left behind following production of the DMD, including gases produced by outgassing from UV-cured adhesives which mount a protective cover to the DMD. A protective cover and other DMD "package" is disclosed in commonly assigned U.S. Pat. No. 5,293,511 entitled "Package for a Semiconductor Device", the teachings of which are incorporated herein by reference.

Sticking of the reflector to the landing electrode has been overcome by applying selected numbers, durations, shapes and magnitudes of voltage pulses ("reset signals") to the control electrode. One type of reset signal attempts to further attract a reflector toward its landing electrode, which the reflector already engages. This further attraction stores additional potential energy in the already deformed beam. When the control electrode is de-energized, the increased potential energy stored in the beam is now able to unstick the reflector from the landing electrode and return the reflector to its normal position. A variant reset signal comprises a train of pulses applied to the control electrode to induce a resonant mechanical wave in a reflector already engaging a landing electrode. De-energizing the control electrode as a portion of the reflector is deformed away from the landing electrode unsticks the reflector. For more details concerning the foregoing and other unsticking techniques, see commonly assigned U.S. Pat. No. 5,096,279 and co-pending patent application Ser. No. 08/311,480, entitled "Manufacturing Method for Micromechanical Devices" filed Sep. 23, 1994, the teachings incorporated herein by reference.

In commonly assigned U.S. Pat. No. 5,331,454 entitled "Low Reset Process for DMD", there is disclosed a technique for passivating or lubricating the portion of the landing electrode engaged by the deformed reflector, and/or the portion of the deformed reflector which engages the landing electrode, so that sticking or adherence therebetween is reduced or eliminated. Passivation is effected by lowering the surface energy of the landing electrode and/or the reflector, which is, in turn, effected by chemically vapor-depositing on the engageable surfaces of interest a monolayer of a long-chain aliphatic halogenated polar compound, such as a perfluoroalkyl acid. This acid is characterized by a chain having an $F_3C$ molecule at a first end, a COOH molecule at the second end, and intermediate $CF_2$ molecules. The COOH end becomes firmly attached to surfaces of the DMD—following pretreatment of such surfaces, if necessary, to achieve same—to present the very low surface energy $F_3C$ and $CF_2$ molecules for engagement. The application of such a compound to at least that portion of the landing electrode which is engaged by a deformed reflector has resulted in an amelioration of the sticking or adhesion problem.

Objects do not easily, if at all, stick or adhere to low energy surfaces, which are also usually expected to be resistant to sorption thereonto of the above-discussed high-surface-energy-imparting substances, such as water vapor. However, while DMD's on which the above-described anti-stick monolayer has been deposited initially exhibit little, if any, reflector-electrode adherence—as evidenced by the low magnitudes of reset signals—after time, higher magnitudes of reset signals are required. Similarly, when protective, light-transparent covers are mounted to DMD's with adhesives, such as UV-cured epoxies, a need to increase the magnitude of reset signals over time has been noted. A similar effect has also been noted in DMD's after several hours of "burn-in." The foregoing suggests that substances—in the first case from the ambient, in the second case outgassed from the adhesive, in the third case outgassed from the DMD—are adhering to or becoming incorporated into the low surface energy anti-stick deposit, possibly due to defects or discontinuities in the films (or coatings) thereof.

Elimination of the sticking phenomenon described above over the lifetime of the device is an object of the present invention.

SUMMARY OF THE INVENTION

The present invention achieves technical advantages as a micromechanical device having an enclosed source time-releasing a passivant, whereby the tendency of engaged or contacted elements to stick, adhere, or otherwise resist separation is ameliorated or eliminated over the life of the device. In the preferred embodiment of the present invention a molecular sieve or binder is impregnated with a passivant, this binder being disposed within an enclosure of the micromechanical device. Over time, this molecular sieve or binder will time release the passivant to continuously coat the surfaces of engaging elements. By continuously coating the surfaces of the engaging elements, the tendency for contacting elements to stick, adhere or otherwise resist separation is ameliorated or eliminated continuously over time. The present invention is particularly useful for reducing the tendency for elements to stick that repeatedly engage one another, such as micromirrors of a DMD device manufactured by Texas Instruments of Dallas Texas. The present invention is also useful for other types of devices, including micromechanical devices encompassing actuators, motors, sensors, and spatial light modulators.

The present invention comprises a device having a sealed enclosure surrounding an electronic device. A source material is disposed within this sealed enclosure. This material includes a passivant, whereby the material releases the passivant over time to maintain a passivation coating of the electronic device. Preferably, the material comprises a molecular sieve or binder. Such a material could also comprise of an adhesive or a paste. Preferably, the passivant comprises PFDA. In addition to the time-release passivant, the material may also comprise a desiccant or getter. This material is also impregnated with the desiccant, the desiccant preferably being an alumino-silicate. The device is preferably a micromechanical device, however, limitation to such a device or circuit is not to be inferred. The enclosure is preferably hermetically sealed to reduce the tendency for moisture to enter the sealed enclosure. The impregnated material is preferably disposed on an interior of the surface, preferably, above the electronic device such as on the lid of the device.

The present invention is particularly useful to continuously reduce the tendency for movable elements to stick or adhere to one another over an extended time. The present invention supplements the passivation provided on the engaging surfaces of the device at the time of manufacture, allowing the engaging elements to remain passivated over the life of the device, even when the moving elements repeatedly engage each other.

DETAIL DESCRIPTION OF THE PREFERRED EMBODIMENT

Figure 1:
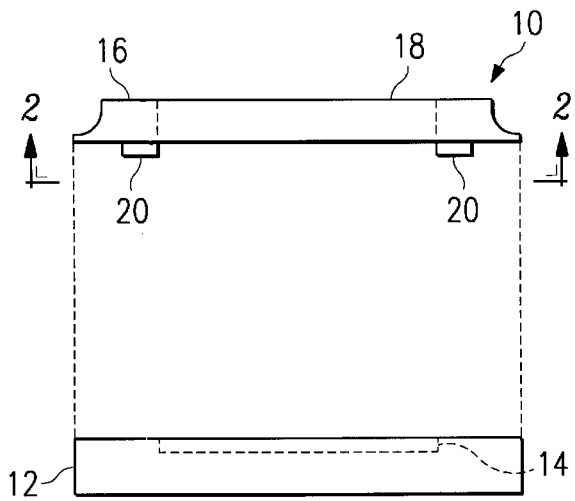
FIG. 1 is an exploded view of a package for a spatial light modulator (SLM) device of the digital micromirror device (DMD) type, having a material impregnated with a passivant being located within an enclosure of the device.

Referring now to FIG. 1, there is generally shown at 10 an electronic device of the micromechanical type. By way of example and for purposes of illustration, device 10 is a spatial light modulator (SLM) being a digital micromirror device (DMD), such as that manufactured by Texas Instruments of Dallas Tex. For further description and understanding of the DMD, reference is made to those patents discussed earlier in the section Background of the Invention, the teachings of which are incorporated herein by reference. The present invention is described and illustrated with regard to use in a DMD, however, limitation to such uses is not to be inferred. For instance, the present invention is well suited for use in other micromechanical devices including actuators, motors, sensors, spatial light modulators, etc.

Still referring to FIG. 1, device 10 is seen to have a ceramic base 12 with a DMD die 14 attached thereto. DMD 14 is an integrated circuit comprising an array of tiny micromirrors suspended over an array of address electrodes. Each of these mirrors is bistable, capable of rotating on either side of a torsion axis to modulate incident light directed thereupon when implemented in a display device, such as a projector or T.V., or in a hard copy printer. The mirrors land upon landing electrodes, the subject of the present invention.

Figure 2:
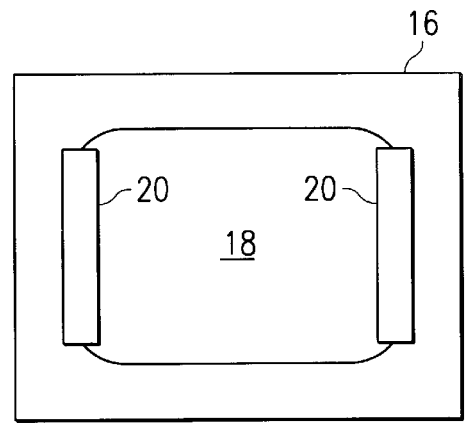
FIG. 2 is an underside view of the lid taken along line 2—2 in FIG. 1 illustrating the material applied as strips, one on each side of a window, the material being a paste or adhesive.

Although shown in exploded form in FIG. 1, a ceramic lid 16 having a window 18 is hermetically sealed upon base 12. Affixed along a pair of opposing edges of window 18 is a pair of material strips 20. Strips 20 are preferably a molecular sieve/binder combination. The material is preferably a polymer, such as polyvinyl butyral. The material is adhered to the underside of lid 16 as a paste or adhesive. Referring to FIG. 2, the location of each strip 20 when affixed to lid 16 each side of window 18 is shown. As will be described in regard to FIG. 3 shortly, the material strips 20 are impregnated with a passivant, preferably a long-chain aliphatic halogenated polar compound, such as perfluoroalkanoic acid (PFDA), although limitation to these particular passivants is not to be inferred. For a general teaching of applying PFDA to the landing electrodes of a DMD device, cross reference is made to commonly assigned U.S. Pat. No. 5,331,454 entitled "Low Resist Voltage Process for DMD". The teachings incorporated herein by reference.

The present invention is particularly characterized in that the material strips 20 are impregnated with a passivant, the material time-releasing the passivant within the enclosure of device 10. By time releasing this passivant, repeatably engaging surfaces of the micromechanical device, such as the mirror tips and the landing electrodes of the DMD device, are continuously passivated. While passivating the landing electrodes and/or the mirror tips at time of manufacture as taught in the co-pending patent application and commonly assigned patent is beneficial, the present invention continuously passivates these engaging moving surfaces over time to reduce the tendency for these moving devices to stick, adhere, or otherwise resist separation. In the case of the DMD device, it is expected that the mirrors will land and separate up to $10^{12}$ times over their lifetime. Considering the significant number of times the mirrors will land and release, whereby the passivant on the surfaces could otherwise tend to wear away, the present invention achieves technical advantages by continuously passivating these engaging surfaces.

Preferably, strips 20 are also impregnated with a desiccant (getter) to absorb any moisture which may enter the chamber of the hermetically sealed device 10. Such getters may be of the non-evaporating type, such as those disclosed in co-pending patent application Ser. No. 08/401,048 entitled "Micro-Mechanical Device", the teaching of which is incorporated herein by reference.

Figure 3:
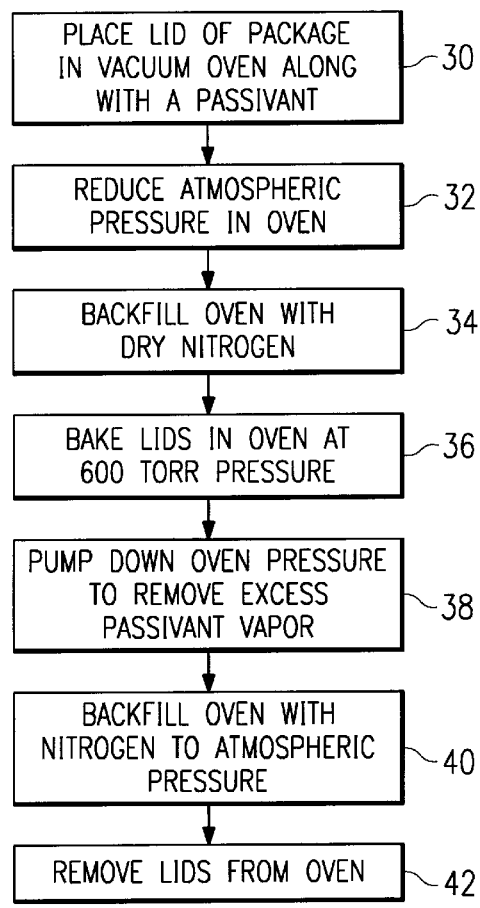
FIG. 3 is flow diagram of a method for impregnating the material with a passivant after the material is applied to the lid.

Referring now to FIG. 3, there is shown a method for impregnating the molecular sieve/binder materials 20 once adhered to lid 16. The molecular sieve/binder is applied as a paste or adhesive to the underside of lid 16, adjacent window 18 as shown in FIG. 2. Care is taken so as not to obstruct any light from being transmitted through window 18.

At step 30, lid 16 is placed in a vacuum oven at 100° Celsius along with 55 to 165 milligrams of solid, high purity (>99%) PFDA. Preferably, the lids are placed upright in slotted tray. The amount of PFDA is proportional to the number of windows being passivated.

At step 32, the oven door is closed, and the atmosphere inside the oven is reduced to below 10 torr. This removes air from the oven.

At step 34, immediately after reaching the low pressure of 10 torr, the oven is backfilled with dry nitrogen to a pressure of about 600 torr.

At step 36, the lids 16 are kept in the oven for 120 minutes at the 100° Celsius and 600 torr pressure.

At step 38, the oven is then pumped down to between 10 and 30 torr for 8 minutes to remove excess PFDA vapor.

At step 40, the oven is then backfilled again with nitrogen to atmospheric pressure (760 torr), and the lids 16 are subjected to this pressure for 30 minutes.

At step 42, the lids 16 are removed from the oven, and are stored in a dry atmosphere (<1,000 PPM moisture) until they are to be hermetically attached to base 12. When attached to base 12, the lids are seam welded to a package seal ring (not shown), that is interposed between lid 16 and base 12, which ring is preferably a refractory material (ceramic).

Although the preferred method for impregnating the molecular sieve/binder strips 20 has been set forth in FIG. 3, other methods for impregnating the material strips 20 with a passivant can be performed without departing from the scope of the present invention. This preferred method effectively impregnates the strips 20 and has achieved desirable results.

The present invention achieve technical advantages by providing a continuous source of a passivant within a sealed enclosure of an electronic device. The impregnated material strips 20 provide a continuous source of a passivant such as PFDA whereby the movable engaging elements of a circuit, such as the mirrors and landing electrodes of a DMD 14, are continuously passivated throughout the life of the device to minimize or reduce sticking, adhering, or resisting separation (collectively stiction). While the present invention finds desirable use in a micromechanical device, providing a time-release passivant source within an enclosure of an electronic circuit, such as actuators, motors, sensors and spatial light modulators, is encompassed by the present invention. The present invention is also well suited for use with a getter to remove moisture from the enclosure of the electronic device.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A device comprising:
   a sealed enclosure surrounding a micromechanical device; and
   material disposed in said sealed enclosure, said material including a long-chain aliphatic halogenated compound passivant, whereby said material releases said passivant continuously to coat contacting surfaces of said microelectronic device.

2. The device as specified in claim 1 wherein said material further comprises a desiccant (getter).

3. The device as specified in claim 1 wherein said material is impregnated with said passivant.

4. The device as specified in claim 1 wherein said material is a polymer.

5. The device as specified in claim 1 wherein said passivant comprises PFDA.

6. The device as specified in claim 1 wherein said desiccant comprises an alumino-silicate.

7. The device as specified in claim 1 wherein said material comprises an adhesive or paste.

8. The device as specified in claim 1 wherein said material comprises a molecular sieve/binder.

9. The device as specified in claim 1 wherein said electronic device is a micromechanical device.

10. The device as specified in claim 9 wherein said micromechanical device is a spatial light modulator.

11. The device as specified in claim 1 wherein said enclosure is hermetically sealed.

12. The device as specified in claim 1 wherein said material is disposed on an interior surface of said enclosure.

13. The device as specified in claim 12 wherein said material is affixed on a top interior surface of said enclosure above said electronic device.

14. The device as specified in claim 1 wherein said material is polyvinyl butyral.

15. A device comprising:
    a sealed enclosure surrounding a micromechanical device; and
    material disposed in said sealed enclosure, said material including a passivant comprised of a perfluoroalkanoic acid, whereby said material releases said passivant continuously to coat contacting surfaces of said microelectronic device.

* * * * *